(12) United States Patent
Lin et al.

(10) Patent No.: US 12,550,760 B2
(45) Date of Patent: Feb. 10, 2026

(54) SEMICONDUCTOR DEVICE

(71) Applicant: InnoLux Corporation, Viao-Li County (TW)

(72) Inventors: Te-Hsun Lin, Miao-Li County (TW); Wen-Hsiang Liao, Miao-Li County (TW); Ming-Hsien Shih, Miao-Li County (TW); Yung-Feng Chen, Miao-Li County (TW); Cheng-Chi Wang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 491 days.

(21) Appl. No.: 18/083,561

(22) Filed: Dec. 18, 2022

(65) Prior Publication Data

US 2024/0145370 A1 May 2, 2024

(30) Foreign Application Priority Data

Oct. 26, 2022 (CN) .......................... 202211320419.6

(51) Int. Cl.
*H01L 23/498* (2006.01)
*H01L 23/00* (2006.01)

(52) U.S. Cl.
CPC .. *H01L 23/49838* (2013.01); *H01L 23/49816* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ......... H01L 23/49838; H01L 23/49816; H01L 24/16; H01L 24/32
See application file for complete search history.

(56) References Cited

U.S. PATENT DOCUMENTS

| | | | |
|---|---|---|---|
| 6,656,827 B1 * | 12/2003 | Tsao .................. | H01L 23/49838 257/E23.079 |
| 7,652,361 B1 | 1/2010 | Yoshida | |
| 8,971,676 B1 * | 3/2015 | Thacker ................. | G02B 6/428 385/14 |
| 9,786,308 B1 * | 10/2017 | McNeill ............... | G11B 5/4853 |

(Continued)

FOREIGN PATENT DOCUMENTS

| | | | | |
|---|---|---|---|---|
| CN | 103748678 A | * | 4/2014 | ....... H01L 23/49838 |
| CN | 105374779 | | 3/2016 | |

(Continued)

*Primary Examiner* — Laura M Menz
(74) *Attorney, Agent, or Firm* — Winston Hsu

(57) ABSTRACT

A semiconductor device includes a first region and a second region, and the second region surrounds the first region. The semiconductor device includes at least one electronic unit, a redistribution structure, a plurality of first pads, and a plurality of second pads. The redistribution structure may be electrically connected to at least one electronic unit. A plurality of first pads are arranged on the redistribution structure and correspondingly to the first region. There is a first pitch between two adjacent first pads. A plurality of second pads are arranged on the redistribution structure and correspondingly to the second region. There is a second pitch between two adjacent second pads, so that the first pitch is smaller than the second pitch.

18 Claims, 9 Drawing Sheets

(56) References Cited

U.S. PATENT DOCUMENTS

| | | | |
|---|---|---|---|
| 9,818,659 B2* | 11/2017 | Bishop | H01L 24/20 |
| 10,446,530 B2* | 10/2019 | Mortensen | H01L 24/43 |
| 10,607,976 B2* | 3/2020 | Mortensen | H01L 24/85 |
| 11,699,654 B2* | 7/2023 | Chen | H01L 23/5226 257/737 |
| 11,798,932 B2* | 10/2023 | Mortensen | H01L 24/85 |
| 11,978,730 B2* | 5/2024 | Mortensen | H05K 1/113 |
| 12,107,082 B2* | 10/2024 | Mortensen | H01L 25/105 |
| 12,205,854 B2* | 1/2025 | Chen | H01L 24/19 |
| 2013/0270698 A1 | 10/2013 | Chen | |
| 2013/0271907 A1* | 10/2013 | Mortensen | H01L 24/43 29/829 |
| 2014/0321803 A1* | 10/2014 | Thacker | H01L 25/0652 385/14 |
| 2014/0321804 A1* | 10/2014 | Thacker | H01L 25/0655 385/14 |
| 2015/0035160 A1* | 2/2015 | Sutardja | H01L 21/6835 438/126 |
| 2015/0115454 A1* | 4/2015 | Magnus | H01L 24/96 257/773 |
| 2016/0043051 A1 | 2/2016 | Lin | |
| 2016/0133557 A1* | 5/2016 | Mortensen | H01L 25/105 257/738 |
| 2016/0216445 A1* | 7/2016 | Thacker | G02B 6/4219 |
| 2016/0218093 A1* | 7/2016 | Mortensen | H01L 23/49816 |
| 2017/0103927 A1* | 4/2017 | Bishop | H01L 24/96 |
| 2017/0164458 A1* | 6/2017 | Vrtis | H05K 1/0271 |
| 2018/0076157 A1* | 3/2018 | Hsu | H01L 21/568 |
| 2018/0096939 A1* | 4/2018 | Chiu | H01L 24/05 |
| 2018/0226314 A1* | 8/2018 | Chen | H01L 23/49833 |
| 2019/0051625 A1* | 2/2019 | Hsu | H01L 24/81 |
| 2019/0067231 A1* | 2/2019 | Huang | H01L 24/14 |
| 2019/0318990 A1* | 10/2019 | Nakagawa | H01L 23/482 |
| 2020/0251462 A1* | 8/2020 | Mortensen | H01L 24/11 |
| 2021/0210423 A1* | 7/2021 | Chang | H01L 21/56 |
| 2021/0305212 A1* | 9/2021 | Hsieh | H01L 24/73 |
| 2022/0157799 A1* | 5/2022 | Mortensen | H01L 24/85 705/37 |
| 2022/0238445 A1* | 7/2022 | Olson | H01L 23/5385 |
| 2022/0344318 A1* | 10/2022 | Mortensen | H01L 24/43 |
| 2022/0352066 A1* | 11/2022 | Chen | H01L 23/31 |
| 2022/0415776 A1* | 12/2022 | Chen | H01L 23/49833 |
| 2023/0021362 A1* | 1/2023 | Yoon | H01L 24/13 |
| 2023/0052194 A1* | 2/2023 | Kim | H01L 23/49816 |
| 2023/0139657 A1* | 5/2023 | Yeoh | H01L 23/49816 257/690 |
| 2023/0420355 A1* | 12/2023 | Oh | H01L 23/3128 |
| 2024/0006249 A1* | 1/2024 | Chen | H01L 22/32 |
| 2024/0006401 A1* | 1/2024 | Mortensen | H01L 24/17 |
| 2024/0055311 A1* | 2/2024 | Lin | H01L 24/05 |
| 2024/0096777 A1* | 3/2024 | Kim | H01L 23/49838 |
| 2024/0097640 A1* | 3/2024 | Takano | H03H 3/02 |
| 2024/0145370 A1* | 5/2024 | Lin | H01L 23/49816 |
| 2024/0222350 A1* | 7/2024 | Mortensen | H01L 23/49833 |
| 2024/0258242 A1* | 8/2024 | Park | H01L 25/105 |
| 2024/0404831 A1* | 12/2024 | Kao | H01L 23/562 |
| 2025/0006577 A1* | 1/2025 | Chen | H01L 24/92 |
| 2025/0081333 A1* | 3/2025 | Ting | H05K 1/147 |
| 2025/0105120 A1* | 3/2025 | Hsu | H01L 21/486 |
| 2025/0105130 A1* | 3/2025 | Kao | H01L 21/4857 |
| 2025/0106985 A1* | 3/2025 | Wang | H05K 1/112 |
| 2025/0210489 A1* | 6/2025 | Kao | H01L 24/20 |
| 2025/0226300 A1* | 7/2025 | Hsu | H01L 23/49838 |
| 2025/0246565 A1* | 7/2025 | Wang | H10F 39/811 |

FOREIGN PATENT DOCUMENTS

| | | | | |
|---|---|---|---|---|
| CN | 107895718 | | 4/2018 | |
| CN | 110970386 A | * | 4/2020 | H01L 23/50 |
| CN | 108417559 B | * | 8/2021 | H01L 23/66 |
| EP | 3540769 A1 | * | 9/2019 | H01L 25/0657 |
| EP | 3751604 A1 | * | 12/2020 | H01L 23/49833 |
| EP | 4050649 A1 | * | 8/2022 | H01L 23/49833 |
| EP | 4113597 A1 | * | 1/2023 | H01L 23/49833 |
| KR | 20140054143 A | * | 5/2014 | H01L 25/18 |
| KR | 101681269 B1 | * | 12/2016 | H05K 1/113 |
| KR | 20160138323 A | * | 12/2016 | H01L 25/0657 |
| KR | 101808478 B1 | * | 12/2017 | H01L 25/105 |
| TW | 202038420 A | | 10/2020 | |
| TW | 202238756 A | | 10/2022 | |
| TW | 202329342 A | * | 7/2023 | H01L 23/49838 |
| TW | 202418503 A | | 5/2024 | |
| WO | WO-2013025205 A1 | * | 2/2013 | H01L 24/11 |

\* cited by examiner

SEMICONDUCTOR DEVICE

BACKGROUND OF THE DISCLOSURE

1. Field of the Disclosure

The present disclosure relates to a semiconductor device, in particular is directed to a semiconductor device with a variable pad size or with a variable pitch between adjacent pads.

2. Description of the Prior Art

In the manufacturing process of an electronic device, it is often necessary to package, for example, an electronic unit, such as a known good die (KGD), to forma semiconductor device. For example, after the packaging process, the structural stress on the pads (for example, solder balls) in different regions of the semiconductor device may vary due to factors such as matching of different materials. The difference or unbalance of the stress of the pad structural stress may cause the pad to be easily cracked due to fatigue, peeled off from the wafer, or further cause the semiconductor device to crack, thereby affecting electrical properties or causing reliability problems.

In view of these, how to provide a semiconductor device to reduce electrical problems or reliability problems has become an urgent issue to be solved in the technical field.

SUMMARY OF THE DISCLOSURE

In accordance with some examples of the present disclosure, a semiconductor device which is capable of improving its electrical reliability is provided. The semiconductor device includes a first region and a second region, and the second region surrounds the first region. The semiconductor device includes at least one electronic unit, a redistribution structure, a plurality of first pads and a plurality of second pads. The redistribution structure is electrically connected to the at least one electronic unit. The first pads are disposed on the redistribution structure and disposed to correspond to the first region. There is a first pitch between two adjacent first pads. The second pads are disposed on the redistribution structure and disposed to correspond to the second region. There is a second pitch between two adjacent the second pads, so that the first pitch is smaller than the second pitch.

These and other objectives of the present disclosure will no doubt become obvious to those of ordinary skill in the art after reading the following detailed description of the embodiment that is illustrated in the various figures and drawings.

DETAILED DESCRIPTION

Figure 1:
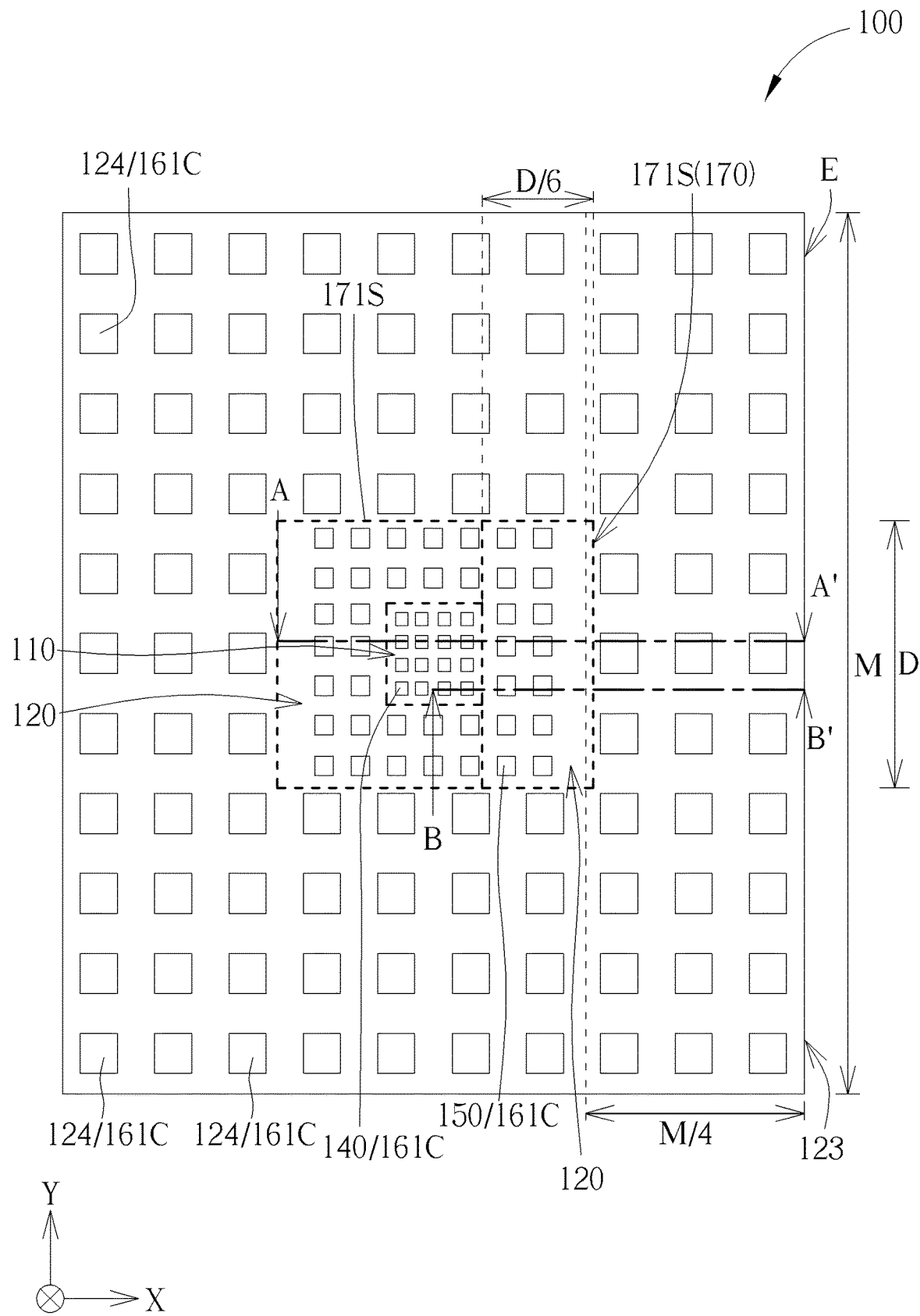
FIG. 1 illustrates a schematic top view of a pad layout pattern which shows first pads, second pads, third pads and a redistribution structure of the semiconductor device according to the first embodiment of the present disclosure

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "contain, but not limited to".

When a component or a film layer is referred to as "disposed on another component or another film layer" or "connected to another component or another film layer", it can mean that the component or film layer is directly disposed on another component or film layer, or directly connected to another component or film layer, or there may be other components or film layers in between. In contrast, when a component is said to be "directly disposed on another component or film" or "directly connected to another component or film", there is no component or film between the two.

When a structure is referred to as "connected to" or "inter-connected to" another structure in some embodiment of the present disclosure, it can mean that the structure directly contacts another structure, or indirectly contacts another structure, or there may be other structures between the two structures. And the terms of "electrically connected to" or "electrically connecting to" may also include a case where any direct or indirect electrical connections are included.

The directional terms mentioned in this text, such as: "up", "down", "front", "rear", "left", "right", etc., are only referring to the directions in the drawings. Accordingly, the directional terms used are for illustration purpose only without limiting the present disclosure.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following may be replaced, recombined, or mixed with one another to constitute another embodiment without departing from the spirit of the present disclosure.

Figure 2:
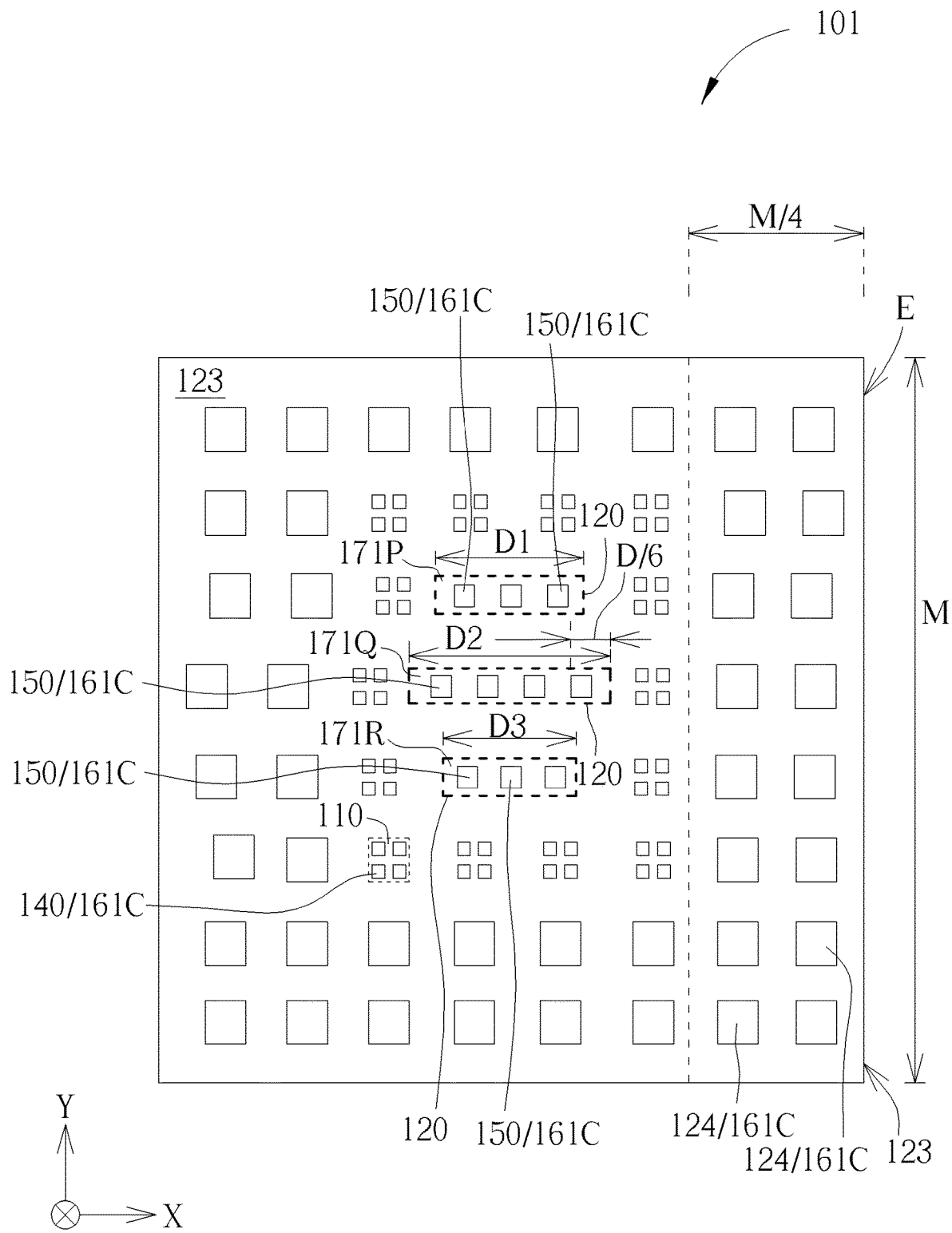
FIG. 2 illustrates a schematic top view of a pad layout pattern of a redistribution structure of the semiconductor device according to the second embodiment of the present disclosure.
Figure 3:
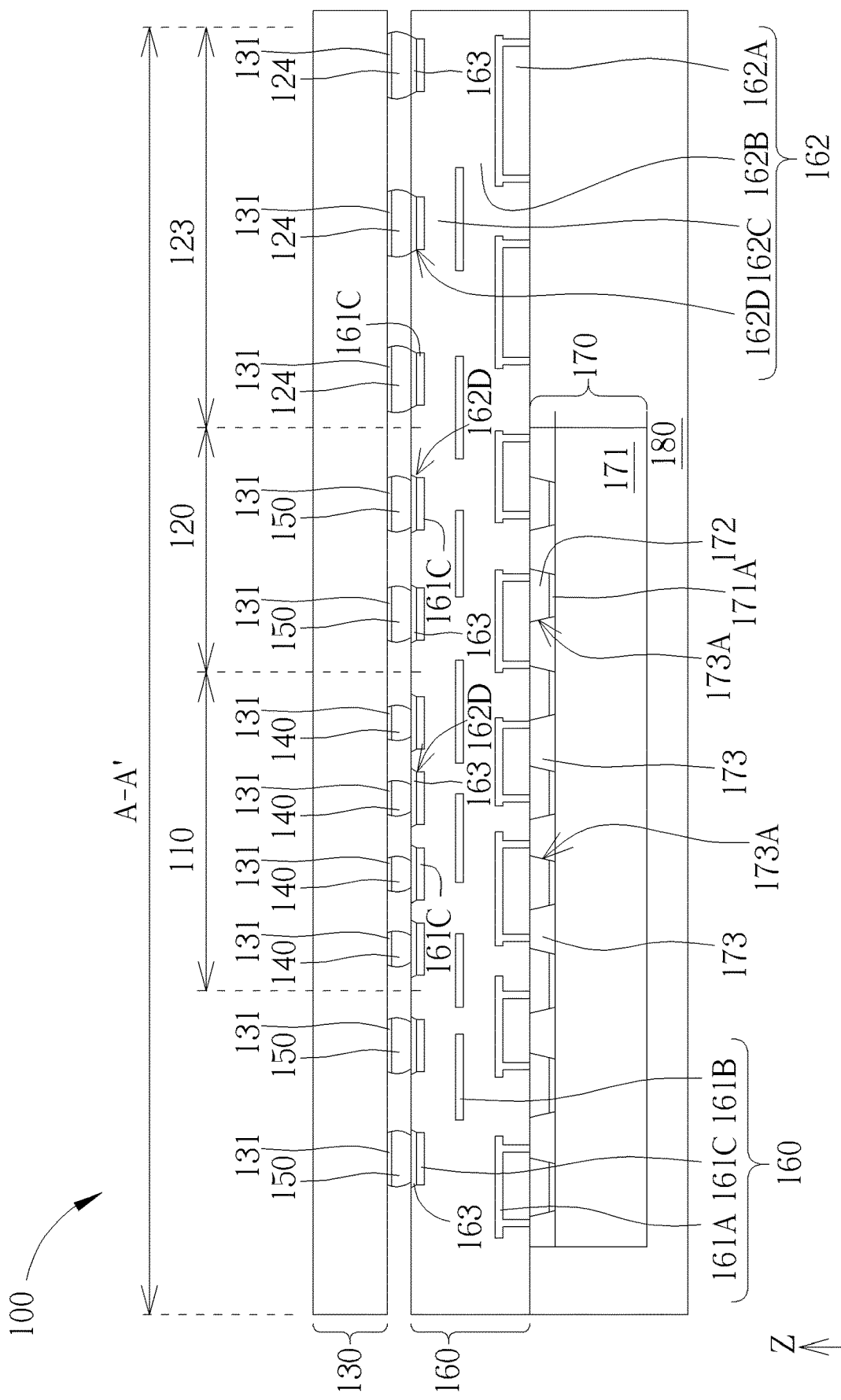
FIG. 3 illustrates a schematic partial cross-sectional view of the semiconductor device along the line A-A' in FIG. 1 according to the first embodiment of the present disclosure.

FIG. 1 illustrates a schematic layout of the conductive layer 161C which shows a plurality of first pads 140, a plurality of second pads 150, a plurality of third pads 124 and a redistribution structure 160 (shown in FIG. 3) of the semiconductor device 100 according to the first embodiment of the present disclosure, which may also be regarded as a schematic top view of the semiconductor device 100. FIG. 2 illustrates a schematic layout or a schematic top view of the conductive layer 161C which shows a plurality of first pads 140, a plurality of second pads 150, a plurality of third pads 124, and a redistribution structure 160 (shown in FIG. 3) of the semiconductor device 101 according to the second embodiment of the present disclosure. FIG. 3 illustrates a schematic partial cross-sectional view of the semiconductor device 100 along the line A-A' in FIG. 1 according to the first embodiment of the present disclosure. In the present disclosure, the semiconductor device 100 may include a display device, a backlight module including a light-emitting device, a solar cell, a sensing device, a vehicle device, a high-frequency device, or a packaging device, etc., but the present disclosure is not limited thereto. A package element may include some configurations, for example, a system-in-package (SiP) or a system-on-chip (SoC), but the present disclosure is not limited thereto. If the electronic device 100 is for use in packaging, it may be applied to packaging methods such as the wafer level packaging (WLP) or the panel level packaging (PLP), for example, may include encapsulation methods such a chip-first method or a redistribution-layer-first method, but the present disclosure is not limited thereto. It should be noted that, the electronic device may be any combination of the aforementioned devices, but the present disclosure is not limited thereto. The embodiments of the present disclosure illustrate the combinations of one or more electronic units, redistribution structures, a plurality of first pads, a plurality of second pads, bonding pads, insulating layers, and circuit layers which are encapsulated in a protection layer, wherein the electronic unit of the present disclosure may be an example of a fan-out packaged semiconductor device, but the present disclosure is not limited thereto. Hereinafter, a semiconductor device will be exemplified by a package device to illustrate the present disclosure, but the present disclosure is not limited thereto.

First, please refer to FIG. 1, FIG. 2 and FIG. 3 together. The semiconductor device 100 includes a first region 110 and a second region 120, or further includes an optional third region 123, wherein the second region 120 surrounds the first region 110. According to some embodiments, the second region 120 may be disposed to surround or not surround the first region 110, but the present disclosure is not limited thereto. The semiconductor device 100 or the semiconductor device 101 may respectively include at least one electronic unit 170, an optional electronic component 130, a plurality of first pads 140, a plurality of second pads 150, a redistribution structure 160, and a protection layer 180, but the present disclosure is not limited thereto. At least one electronic element 130 may be electrically connected to at least one electronic unit 170. According to some embodiments, at least one electronic element 130 may be disposed to correspond to at least one of the first region 110 and the second region 120, for example, the electronic element 130 may be disposed to correspond to the first region 110, or to the second region 120, or to both the first region 110 and the second region 120 at the same time. The electronic device 130 may be electrically connected to at least one electronic unit 170 via the bonding pads 131 of the electronic device 130, at least one of the first pads 140 and the second pads 150 and the redistribution structure 160. The electronic components 130 may include a bendable or flexible printed circuit board (PCB), a circuit component, a driving circuit component, a resistor, a capacitor, an inductor, a sensing component, an antenna component, or other suitable electronic components, but the present disclosure is not limited thereto. The circuit element or the driving circuit element may include a semiconductor material or a thin film transistor, but the present disclosure is not limited thereto.

A plurality of first pads 140 and a plurality of second pads 150 may be respectively disposed on the redistribution structure 160, so that the first pads 140 may be disposed to correspond to the first region 110, and the second pads 150 may be disposed to correspond to the second region 120. For example, "disposed to correspond to" may refer to a given element which is arranged adjacent to a reference element, but the given element may or may not directly contact the reference element. As far as the illustrations in FIG. 3 are concerned, along the normal direction of the semiconductor device 100 (direction Z) or along the top view direction when the given element overlaps the reference element, it may be regarded as that the given element is disposed to correspond to the reference element. The redistribution structure 160, the first pads 140 or the second pads 150 may be respectively solder balls or components which may be used for butt connection and electrical connection, and may be disposed to correspond to the bonding pads 131 of the electronic components 130 so that the electronic element 130 may be respectively electrically connected to the first pads 140 and to the second pads 150 via the bonding pads 131.

According to some embodiments of the present disclosure, each pad of the first pads 140 or of the second pads 150 may independently have a pad size. In some examples, the pad size of adjacent pads may be different. According to other embodiments of the present disclosure, there may independently be a pad pitch between adjacent first pads 140 or between adjacent second pads 150. In some examples, the adjacent pad pitches may be different. According to other embodiments of the present disclosure, the pad sizes of adjacent pads may be different and the pad pitches of adjacent pads may also be different. In some examples, each pad of the first pads 140 or of the second pads 150 may independently include a conductive material. The conductive material may include, for example, a solder material, a bonding material, an anisotropic conductive film (ACF), a metal pillar, an alloy, other suitable materials, or a combination of the above, etc. for packaging, but the present disclosure is not limited thereto. The metal may include, for example, copper, silver or tin, and the alloy may include, for example, a copper alloy, a silver alloy, or a tin alloy, but the present disclosure is not limited thereto. In some examples, a first pad 140 or a second pad 150 may independently include solder, a bonding pad, an anisotropic conductive film, or a copper pillar, respectively, but the present disclosure is not limited thereto.

The redistribution structure 160 may be electrically connected to the electronic unit 170. According to some embodiments, the redistribution structure 160 may be disposed at least one side of the electronic unit 170, between the first pads 140/second pads 150 and the electronic unit 170, to electrically connect the underlying electronic unit 170, and to the above first pads 140 or the above second pads 150.

The redistribution structure 160 may include a conductive layer 161, for example the conductive layer 161A, conductive layers 161B, the conductive layers 161C to serve as a seed layer, and an insulating layers 162, for example an insulating layers 162A, an insulating layers 162B, and an insulating layers 162C, to be alternately stacked to form single-layer or multi-layer composite layer structure, and may further include a thin film transistors (TFT) to form a composite layer structure. The thin film transistor may include components such as a gate, a source, a drain and a semiconductor material, but the present disclosure is not limited thereto, wherein the conductive layer includes a single layer or a multi-layer stack. The conductive layer 161A and the conductive layer 161B in the conductive layer 161 may each include a seed layer and a copper material, but the present disclosure is not limited thereto. The uppermost insulating layer or the lowermost insulating layer of the redistribution structure 160 may respectively have one or more openings to accommodate the bonding pads of the uppermost conductive layer or of the lowermost conductive layer. For example, in some embodiments, a plurality of first pads 140 or a plurality of second pads 150 may be respectively disposed in one or more conductive layers 161C of the uppermost conductive layer in the one or more openings 162D of the uppermost insulating layer 162C, to be electrically connected to the redistribution structure 160. Please note that, in order to simplify the illustration, the conductive layer 161C in FIG. 1 and in FIG. 2 represents an embodiment in which a plurality of first pads 140 or a plurality of second pads 150 are respectively disposed on the conductive layer 161C, but the present disclosure is not limited to the embodiments regarding the implementation of the shapes of the conductive layer 161C, the first pads 140 and the second pads 150. The semiconductor device includes the redistribution structure 160, for example, to redistribute the circuit or to increase the circuit fan-out range of the electronic unit 170 to increase the number of signal contacts. In some embodiments, a copper-containing under-bump-metallization (UBM) layer 163, for example, may be sandwiched between the conductive layer 161C and respective pads, so that the UBM layer 163 may be a part of the redistribution structure 160. In some embodiments, the materials of the conductive layer 161C to serve as the seed layer may be the same as that of the conductive layer 161A or that of the conductive layer 161B.

The conductive layer of the redistribution structure 160 may include a metal, an alloy, other suitable materials, or a combination of the above conductive materials for use in packaging, but the present disclosure is not limited thereto. The metal may include, for example, copper, nickel, gold, titanium, molybdenum, aluminum or other suitable materials, and the alloy may include, for example, an alloy of the above metals, but the present disclosure is not limited thereto. The insulating layer of the redistribution structure 160 may include an organic dielectric material, an inorganic dielectric material, or a combination of the above dielectric materials for use in packaging, but the present disclosure is not limited thereto. The organic dielectric material may include, for example, an ABF carrier, polyimide (PI), other suitable materials, or a combination of the above organic dielectric materials for use in packaging, but the present disclosure is not limited thereto. The inorganic dielectric material may include, for example, silicon oxide, silicon nitride, aluminum oxide, other suitable materials, or a combination of the above inorganic dielectric materials for use in packaging, but the present disclosure is not limited thereto. The Z direction in FIG. 3 is the stacking direction in which the conductive layers 161 and the insulating layers 162 of the redistribution structure 160 are alternately stacked, or may also be regarded as the normal direction of the semiconductor device 100. The X-direction and the Y-direction together are parallel to the stacked surface of the redistribution structure 160 of the semiconductor device 100, and the X-direction is perpendicular to the Y-direction. Also, the X direction and the Y direction in FIG. 1 or in FIG. 2 are respectively perpendicular to the Z direction shown in FIG. 3.

The electronic unit 170 includes, for example, at least one die 171, a conductive structure 172, and an insulating layer 173. In some embodiments, the electronic unit 170 may include a known good die, a diode, a capacitor, a resistor, an inductor, other suitable electronic components, or a combination thereof, but the present disclosure is not limited thereto. The die 171 is disposed on the protection layer 180, for example, the protection layer 180 may be disposed to surround one or more die 171. For example, to surround may refer to an arrangement in which a given element may contact at least one side surface of a reference element from a cross-sectional view. FIG. 3 shows an arrangement in which the protection layer 180 contacts at least two side surfaces of the die 171. The protection layer 180 may include an epoxy molding compound (EMC), which is beneficial to reduce the influence of the external moisture or oxygen on the electronic unit 170.

The conductive structure 172 and the insulating layer 173 are disposed on the die 171, the conductive structure 172 and the insulating layer 173 are disposed on an active surface of the die 171. The conductive structure 172 and the insulating layer 173 are disposed between the die 171 and the redistribution structure 160. The conductive structure 172 and the insulating layer 173 may be stacked alternately with each other to form a single-layer stack or a multi-layer stack composite layer structure. The insulating layer 173 may be disposed between the redistribution structure 160, the at least one die 171 and the conductive structure 172, and has one or more openings 173A for the accommodation of the conductive structure 172. The conductive structure 172 may be electrically connected to the bonding pads 171A of at least one die 171, so that the first pads 140 or the second pads 150 may be electrically connected to the bonding pads 171A of at least one die 171 via the conductive layer 161 of the redistribution structure 160 and the conductive structure 172. The bonding pads 171A may be the input and output terminals (I/O) of the die 171, but the present disclosure is not limited thereto. The conductive structure 172 may include a metal, an alloy, other suitable materials, or a combination of the above conductive materials for use in packaging, but the present disclosure is not limited thereto. The metal may include, for example, copper, nickel, gold, titanium, molybdenum, aluminum or other suitable metals, and the alloy may include, for example, an alloy of the above metals, but the present disclosure is not limited thereto. The insulating layer 173 may include an organic dielectric material, an inorganic dielectric material, or a combination of the above dielectric materials for use in packaging, but the present disclosure is not limited thereto. The organic dielectric material may include, for example, an ABF carrier, polyimide, other suitable materials, or a combination of the above organic dielectric materials for use in packaging, but the present disclosure is not limited thereto. The inorganic dielectric material may include, for example, silicon oxide, silicon nitride, aluminum oxide, other suitable materials, or a combination of the above inorganic dielectric materials for use in packaging, but the present disclosure is not limited thereto. For example, in some examples, the process steps of the conductive structure 172 may be the same as those of the conductive layer 161 of the redistribution structure 160, or may be fabricated separately.

As shown in FIG. 1 or in FIG. 2, the semiconductor device 100 or the semiconductor device 101 has a device side E, and the device side E has a device side length M. If the semiconductor device 100 or the semiconductor device 101 has the device sides E with unequal longer sides and shorter sides in length, so that the semiconductor device 100 or the semiconductor device 101 has unequal device sides E in length, the longer side of the device side length M is taken as the device side length M of the semiconductor device 100 or of the semiconductor device 101. In some embodiments, the die 171 of the electronic unit 170 in the semiconductor device 100 has a die side 171S, from a top view the die side 171S may not overlap with one of the second pads 150. In some embodiments, the die side 171S may not overlap the second pads 150. The die side 171S has a die side length D. If the die 171 has unequal longer sides and shorter sides in length, so that the die 171 has different die side lengths, the longer side of the die 171 is taken as the die side length D. In other examples, the semiconductor device 101 may include a plurality of dies. For example, the semiconductor device 101 shown in FIG. 2 includes a die 171P, a die 171Q and a die 171R, but the present disclosure is not limited thereto. The die 171P, the die 171Q and the die 171R respectively have the die side length D1, the die side length D2 and the die side length D3 as described above, and the maximum value among the three may be regarded as a representative die side length D.

According to some embodiments of the present disclosure, please refer to FIG. 1, if D>M/2, the second region 120 may correspond to a part of the die 171. For example, the second region 120 may include the die side 171S and a region corresponding to die 171 and including the die side 171S, and have a second region width. According to some embodiments of the present disclosure, the second region width may be a width extending by ⅙D from the die side 171S to a direction perpendicular to the die side 171S. Alternatively, the second region width may be a width extending inwardly by ⅙D along a vertical direction of the die side 171S. The rest of the die 171 outside the second region 120 may be regarded as the first region 110. For example, the first region 110 may be another region within the die 171 that is farther away from the die side 171S than the second region 120, or the first region 110 is said to be the more central region of the die 171. According to other embodiments of the present disclosure, please refer to FIG. 2, if D<M/2, the second region 120 may correspond to an area in the die 171, for example, the second region 120 may correspond to the entire area in the die 171. The area outside the second region 120 may be regarded as the first region 110, for example, the first region 110 may correspond to another area farther away from the second region 120 such that the second region 120 may not surround the first region 110.

After packaging, the structural stress in the semiconductor device may differ due to different environments, thereby forming a high stress region and a low stress region. For example, the stress in the high stress region may be greater than the stress in the low stress region, for example. In some embodiments, the stress in the second region 120 may be greater than the stress in the first region 110, for example. In other words, the structural stress on the second pad 150 may be greater than the structural stress on the first pad 140. In some embodiments, in some variant embodiments or in some variant examples, the present disclosure provides a pad layout solution to help reduce electrical problems or electrical reliability problems which are caused by certain pads which are easily cracked, peeled off from dies, or cracked in semiconductor devices.

FIG. 4A, FIG. 4B, FIG. 4C and FIG. 4D respectively illustrate some schematic top views of various variant embodiments of the pad layouts of the semiconductor device 102, of the semiconductor device 103, of the semiconductor device 104 or of the semiconductor device 105 of the present disclosure. The semiconductor device 102, the semiconductor device 103, the semiconductor device 104 or the semiconductor device 105 of the present disclosure may at least respectively include a first region 110, a second region 120, a plurality of first pads 140 and a plurality of second pads 150, or may further include an optional third region (not shown). The first pads 140 are disposed to correspond to the first region 110, and the second pads 150 are disposed to correspond to the second region 120.

Figure 4A:
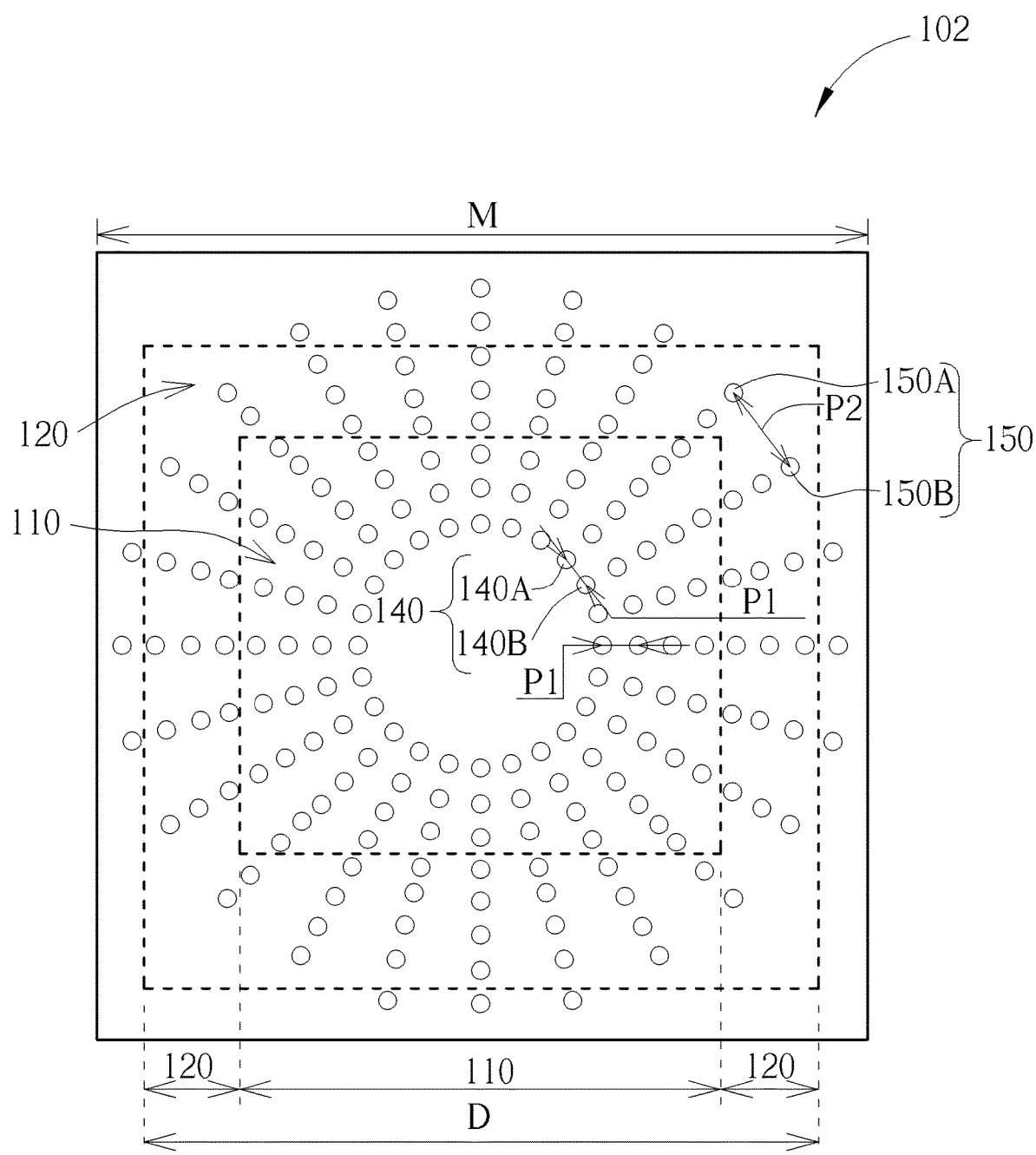
FIG. 4A, FIG. 4B, FIG. 4C and FIG. 4D respectively illustrate some schematic top views of various variant embodiments of the pad layouts of various semiconductor devices of the present disclosure.

According to some variant embodiments of the present disclosure, in the semiconductor device 102 as shown in FIG. 4A, the first pads 140 and the second pads 150 together form an annular layout. For example, the pads may be arranged in a concentric ring-like pattern, but the present disclosure is not limited thereto. Two adjacent first pad 140A and first pad 140B are arranged along a direction, for example, arranged along the tangential direction of the annular pattern, arranged along the X direction or arranged along the Y direction, and two adjacent second pad 150A and second pad 150B are arranged along a direction, for example, continuously arranged along the above-mentioned tangential direction of the annular pattern or along the direction away from the first region 110. There is a first pitch P1 between two adjacent first pad 140A and first pad 140B, and there is a second pitch P2 between two adjacent second pad 150A and second pad 150B. For example, the pitch may refer to the distance of the centerline between two adjacent pads. In the pad layout provided in FIG. 4A of the present disclosure, the first pitch P1 may be arranged to be smaller than the second pitch P2, that is, P1<P2.

Figure 4B:
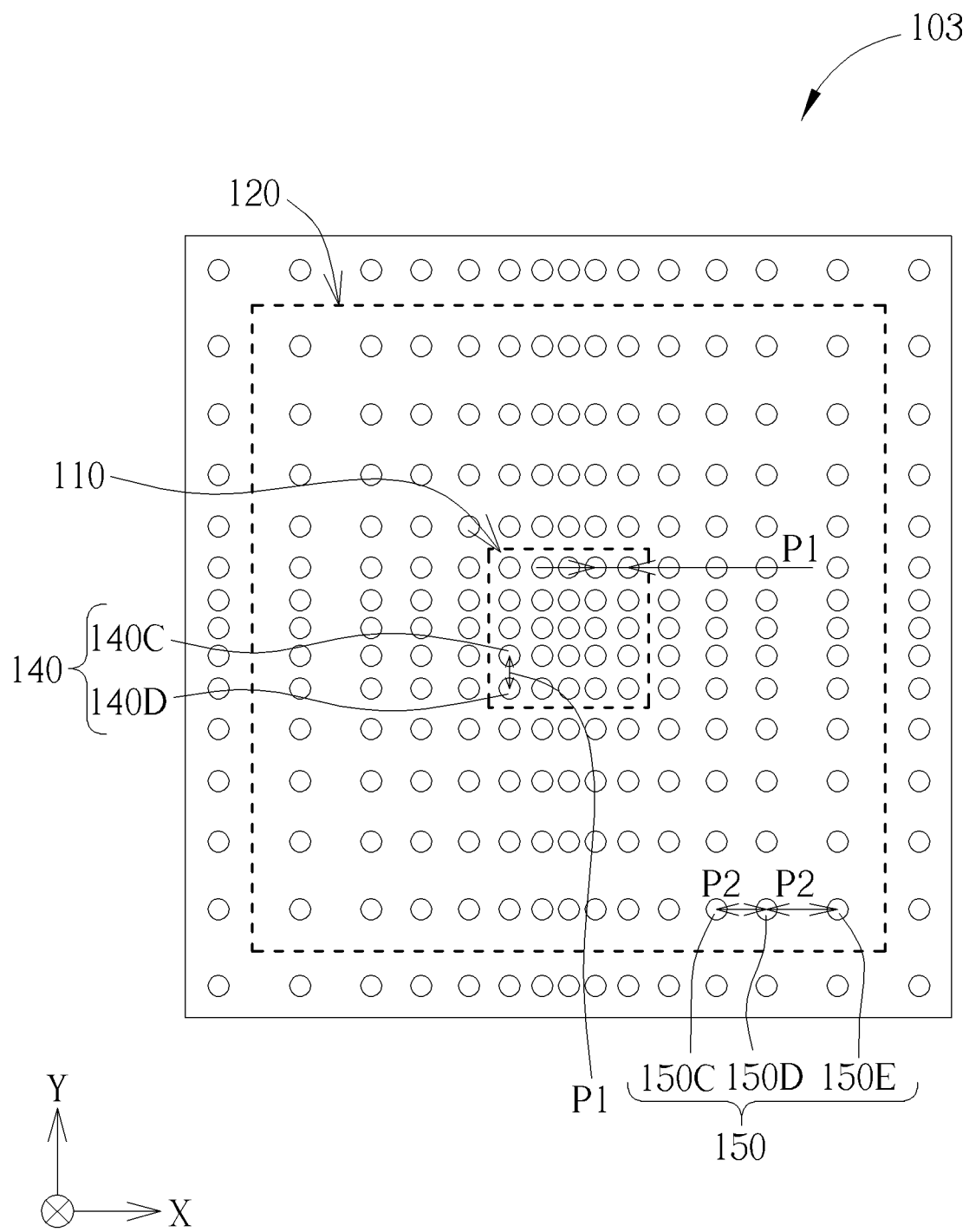

According to some variant embodiments of the present disclosure, in the semiconductor device 103 shown in FIG. 4B, the first pads and the second pads included therein form a matrix layout. Two adjacent first pads 140 and two adjacent second pads 150 are respectively arranged along a direction. For example, the first pad 140C and the first pad 140D may be arranged along the X direction or along the Y direction, and the second pad 150C, the second pad 150D and the second pad 150E may be arranged along the X direction or along the Y direction, for example, continuously arranged along a direction away from the first region 110, but the present disclosure is not limited thereto. In some variant embodiments of the present disclosure, there is a first pitch P1 between two adjacent first pad 140C and first pad 140D, there is a second pitch P2-1 between two adjacent second pad 150C and second pad 150D, and there is a second pitch P2-2 between two adjacent second pad 150D and second pad 150E. In the pad layout illustrated in FIG. 4B of the present disclosure, the first pitch P1 is smaller than the second pitch P2-1, that is, P1<P2-1, or the first pitch P1 is smaller than the second pitch P2-2, that is, P1<P2-2.

Or as shown in FIG. 4B, according to some embodiments of the present disclosure, there are adjacent second pitch P2-1 and second pitch P2-2 disposed between at least three second pad 150C, second pad 150D and second pad 150E arranged along one direction, wherein the second pitch P2-1 and the second pitch P2-2 may be different from each other, that is to say, the second pitch P2-1 and the second pitch P2-2 are variable. According to some embodiments, at least three adjacent second pads are continuously arranged along a direction away from the first region 110, but the present disclosure is not limited thereto. For instance, in some variant examples, the second pitch P2-1 may be greater than the second pitch P2-2. Or in other variant examples, the second pitch P2-1 may be smaller than the second pitch P2-2. In the pad layout shown in FIG. 4B, the second pitch P2-1 which is closer to the first region 110 or to the first pitch P1 may be smaller than the second pitch P2-2 which are farther away from the first region 110 or from the first pitch P1, that is, P2-1<P2-2, but the present disclosure is not limited thereto.

Figure 4C:
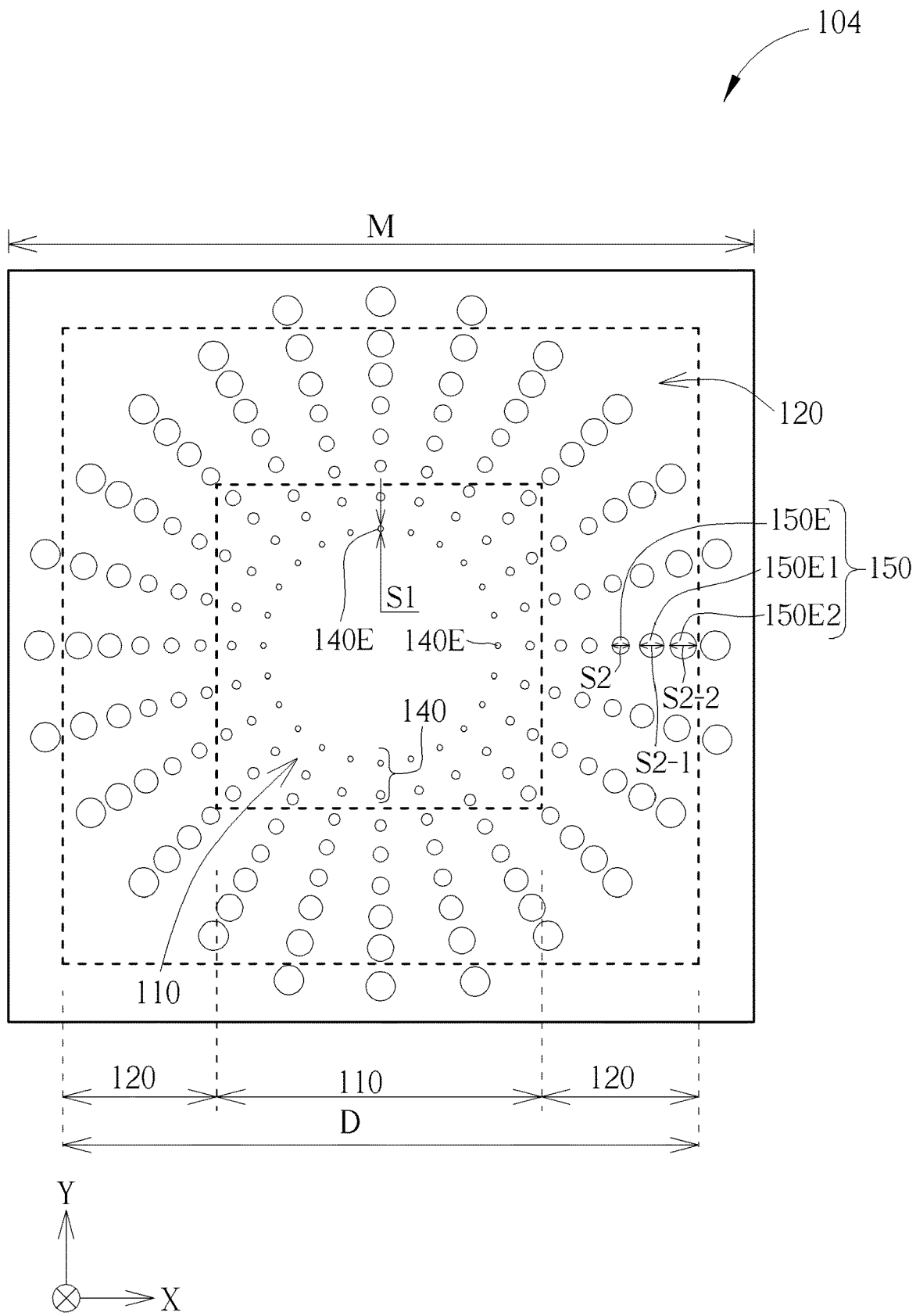
Figure 4D:
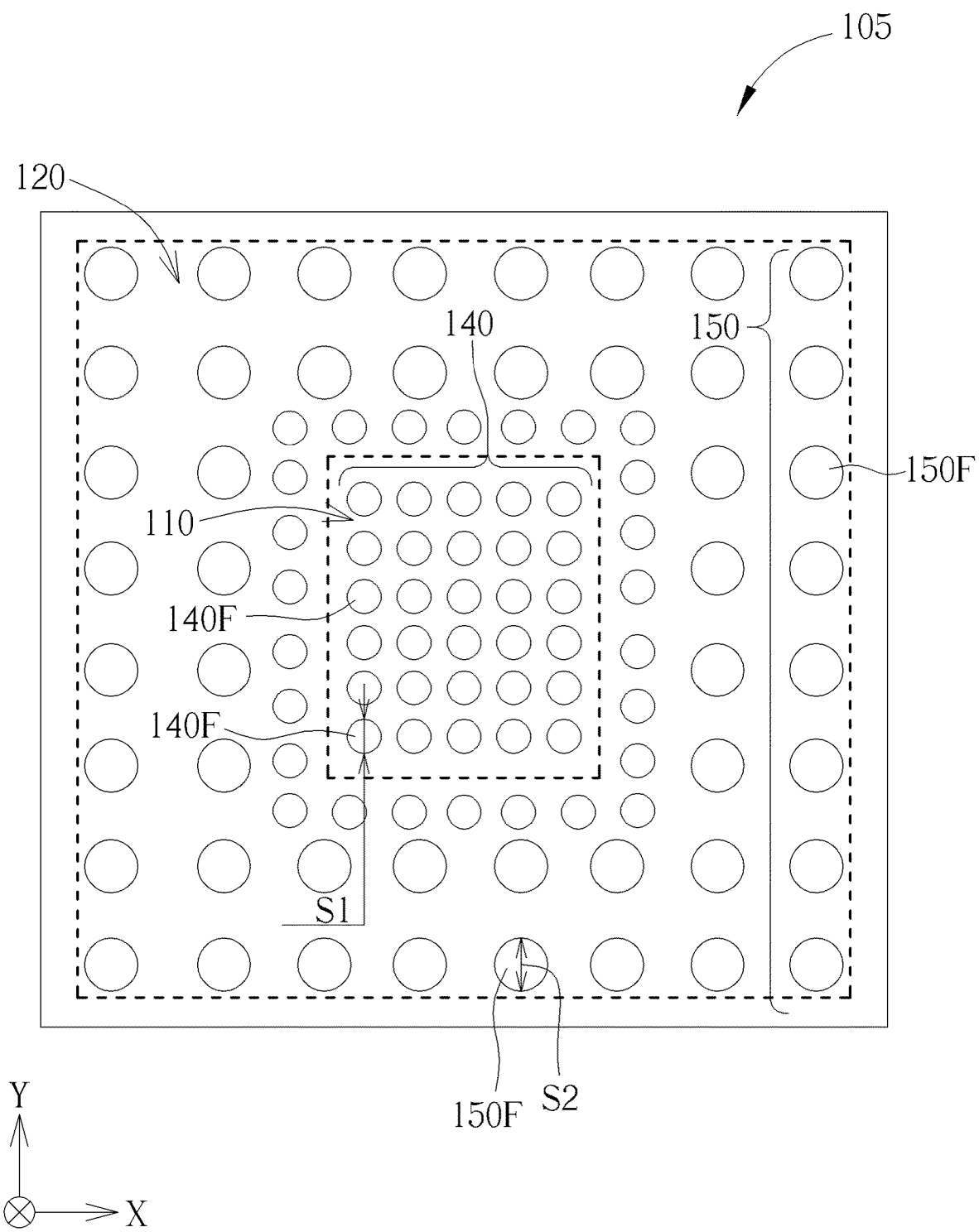

According to some variant embodiments of the present disclosure, the semiconductor device 104 shown in FIG. 4C or the semiconductor device 105 shown in FIG. 4D, wherein FIG. 4C illustrates that the first pads and the second pads form a variant example of a ring-shaped layout or of a radial layout, FIG. 4D illustrates that the first pads and the second pads form a variant example of a matrix layout, but the present disclosure is not limited thereto. The first pads 140 or the second pads 150 of the semiconductor device of the present disclosure may respectively have a pad size. For example, the pad size may represent the largest dimension of a given pad in any direction. For example, the first pad 140E in FIG. 4C may have a first pad size S1 and the second pad 150E may have a second pad size S2. Alternatively, in FIG. 4D, the first pad 140F may have a first pad size S1, and the second pad 150F may have a second pad size S2. The first pad size S1 and the second pad size S2 may be different from each other. In the pad layouts provided by the present disclosure, the first pad size S1 is smaller than the second pad size S2, that is, S1<S2.

According to some variant embodiments of the present disclosure, as shown in FIG. 4C, the second pad 150E, the second pad 150E-1 and the second pad 150E-2 are arranged along one direction. For example, they are arranged along the X direction, or continuously arranged along the direction away from the first region 110, but the present disclosure is not limited thereto. The second pad 150E-1 may have a second pad size S2-1, and the second pad 150E-2 may have a second pad size S2-2. In the pad layout provided in FIG. 4C of the present disclosure, the second pad sizes of different second pads may be different from each other, that is, the second pad size may be variable. In other words, the pad sizes of the second pads between at least three second pads continuously arranged along the direction away from the first region 110 may gradually increase along the arranged direction, for example, in some variant examples, the second pad size S2-1 which is closer to the first pad size S1 may be smaller than the second pad size S2-2 which is farther away from the first pad size S1, that is, S2-1<S2-2. Or, the second pad size S2 which is closer to the first pad size S1 may be smaller than the second pad size S2-1 which is farther away from the first pad size S1, that is, S2<S2-1, so that an increasing relationship S2<S2-1<S2-2 which is arranged along one direction may be satisfied, but the present disclosure is not limited thereto.

Figure 5:
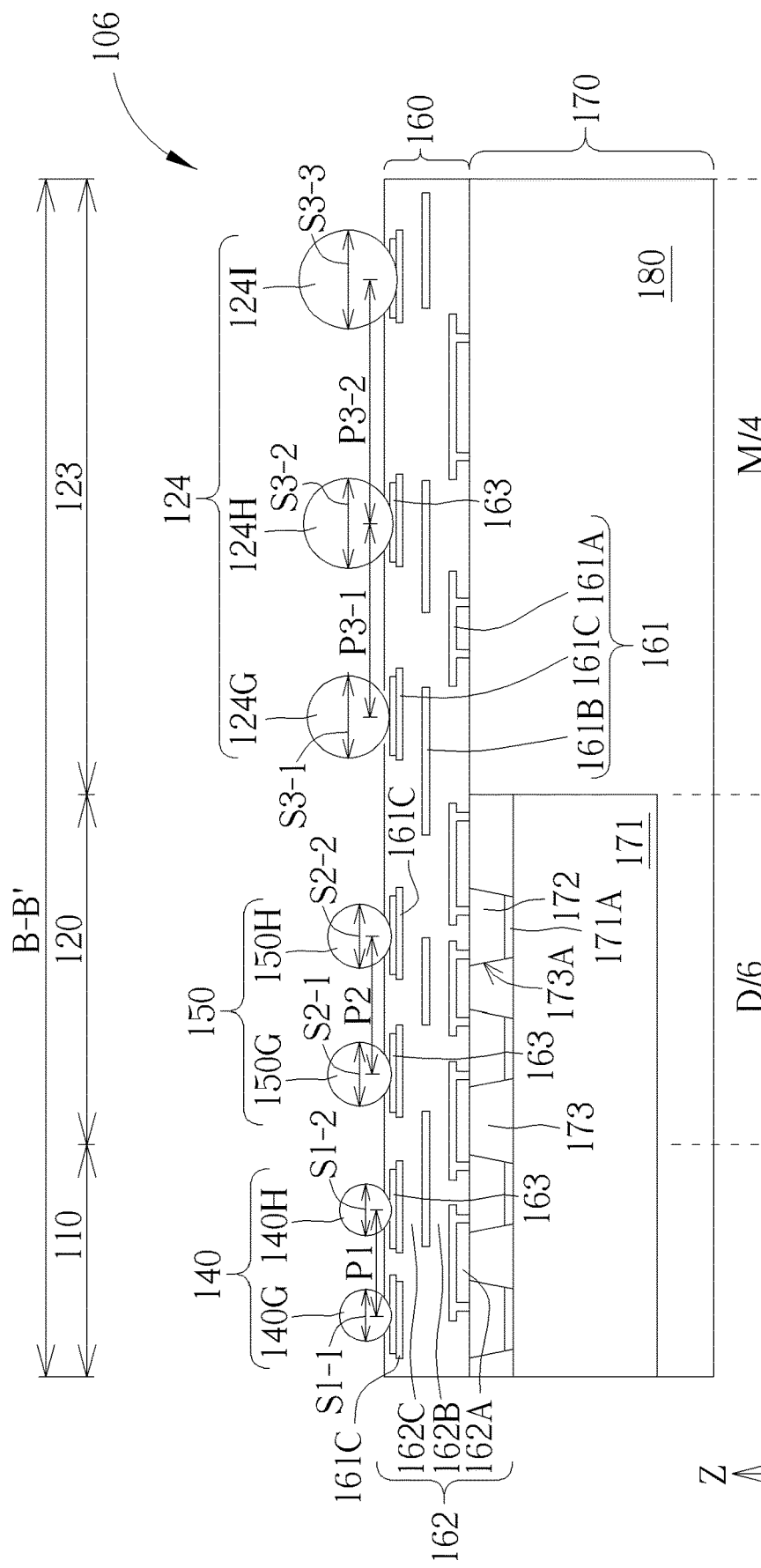
FIG. 5 is a schematic partial cross-sectional view of a variant embodiment of the semiconductor device along the line B-B' in FIG. 1 according to the present disclosure.
Figure 6:
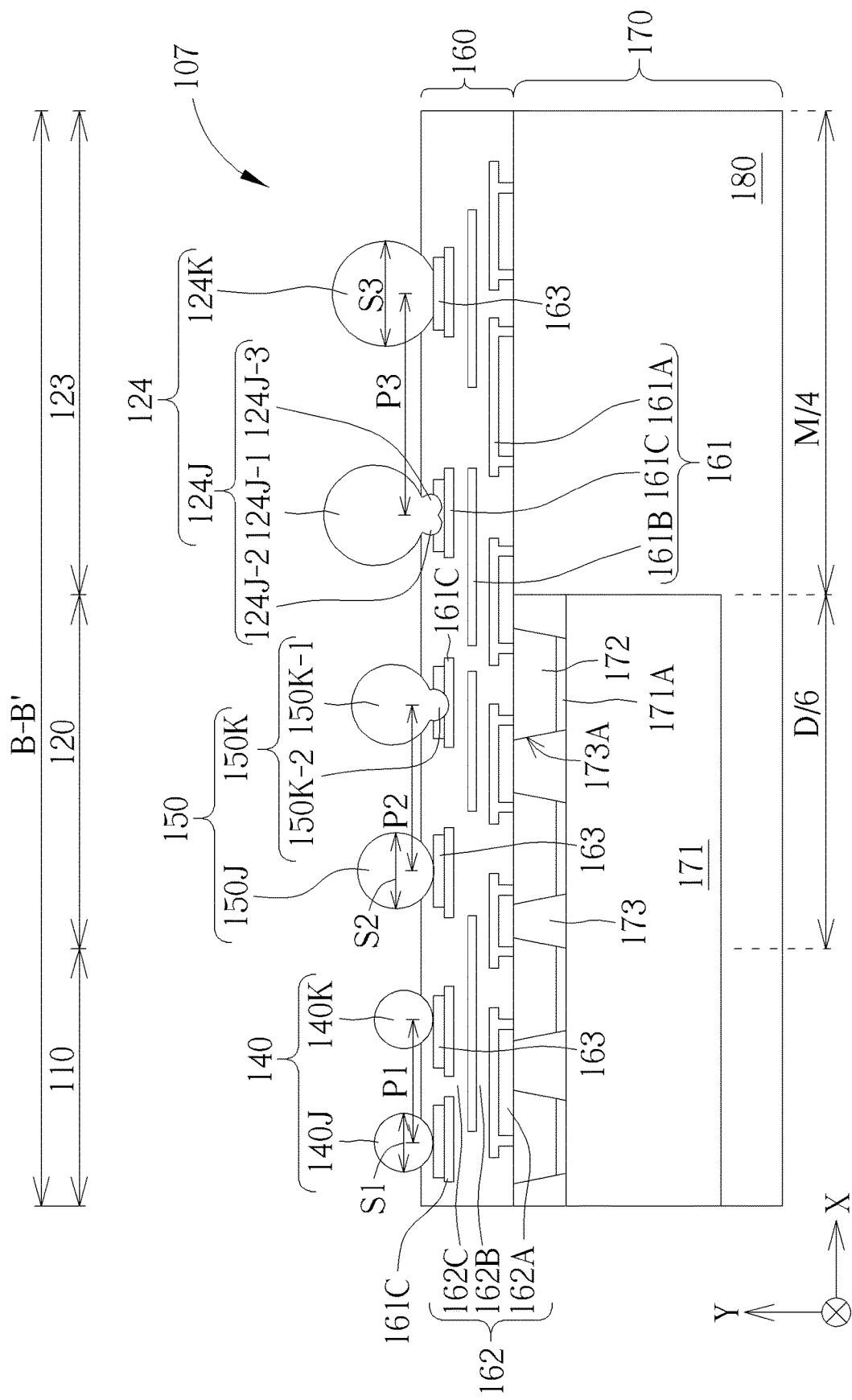
FIG. 6 is a schematic partial cross-sectional view of a variant embodiment of the semiconductor device along the line B-B' in FIG. 1 according to the present disclosure.

FIG. 5 is a schematic partial cross-sectional view of a variant embodiment of the semiconductor device 106 according to the present disclosure along the line B-B' in FIG. 1. FIG. 6 is a schematic partial cross-sectional view of a variant embodiment of the semiconductor device 107 according to the present disclosure along the line B-B' in FIG. 1. Please refer to FIG. 1, FIG. 5 and FIG. 6 together. In some embodiments of the present disclosure, the semiconductor device 106 or the semiconductor device 107 may further include a third region 123 and a plurality of third pads 124 in addition to a first region 110, a second region 120, a plurality of first pads 140, a plurality of second pads 150, a redistribution structure 160, at least one electronic unit 170 and a protection layer 180, so that the third region 123 is arranged to surround the second region 120. For example, the second region 120 may be disposed between the first region 110 and the third region 123 while the third pads 124 are disposed on the redistribution structure 160 and are disposed to correspond to the third region 123.

In some embodiments, the stress in the third region 123 may be greater than the stress in the second region 120, for example. In other words, the structural stress on the third pads 124 may be greater than the structural stress on the second pads 150. Please note that, in order to simplify the illustrations, the conductive layer 161C in FIG. 1 and in FIG. 2 represents an example where there are a plurality of first pads 140, a plurality of second pads 150, or a plurality of third pads 124 respectively disposed on the conductive layer 161C, but the present disclosure is not limited to the implementation of the shapes of the conductive layer 161C, the first pads 140, the second pads 150, and the third pads 124. Please refer to the above descriptions for the details of the first region 110, of the second region 120, of the first pads 140 such as a first pad 140G, a first pad 140H, a first pad 140J and a first pad 140K, of the second pads 150 such as a second pad 150G, a second pad 150H, a second pad 150J and a second pad 150K, of the redistribution structure 160, of at least one electronic unit 170, and of the protection layer 180.

As shown in FIG. 5, each one of the third pads 124 may have a third pad size S3. For example, the third pads 124 may include at least the third pad 124G, the third pad 124H and the third pad 124I which are arranged along the X direction or along the Y direction, for example, continuously arranged along the direction away from the second region 120. The third pad 124G may have a third pad size S3-1, the third pad 124H may have a third pad size S3-2, and the third pad 124I may have a third pad size S3-3. According to some embodiments of the present disclosure, the second pad size S2 may be smaller than the third pad size S3, that is, S2<S3, but the present disclosure is not limited thereto.

According to other embodiments of the present disclosure, the third pad sizes of different third pads 124 may be different from each other, that is, the third pad size may be variable. For example, the third pad sizes of at least three third pads may gradually increase along an arranged direction away from the second region 120. For example, the third pad size S3-1 which is closer to the second pad 150H may be smaller than the third pad size S3-2 of the third pad 124H which is farther away from the second pad 150H, that is, S3-1<S3-2. Alternatively, the third pad size S3-2 of the third pad 124H which is closer to the second pad 150H may be smaller than the third pad size S3-3 of the third pad 124I which is farther away from the second pad 150H, that is, S3-2<S3-3, but the present disclosure is not limited thereto. Please refer to the above descriptions for details of the third pads 124.

There is a third pitch P3-1 between the two adjacent third pad 124G and third pad 124H, and there is a third pitch P3-2 between two adjacent third pad 124H and third pad 124I. For example, there are adjacent third pitch P3-1 and third pitch P3-2 disposed between at least three the third pad 124G, the third pad 124H and the third pad 124I which are continuously arranged along a direction away from the second region 120. According to some embodiments of the present disclosure, the second pitch may be smaller than the third pitch, for example, the second pitch P2 may be smaller than the third pitch P3-1, that is, P2<P3-1, or the second pitch P2 may be smaller than the third pitch P3-2, that is, P2<P3-2, but the present disclosure is not limited thereto. In some variant examples, the adjacent third pitch P3-1 and third pitch P3-2 which are continuously arranged along a direction away from the second region 120 may be different from each other, that is to say, the third pitch P3-1 and the third pitch P3-2 are variable. For example, the third pitch P3-1 may be greater than the third pitch P3-2, that is, P3-2<P3-1. Or in some variant examples, the third pitch P3-1 may be smaller than the third pitch P3-2, that is, P3-1<P3-2. In the pad layout shown in FIG. 5, the third pitch P3-1 which is closer to the second pad 150H is smaller than the third pitch P3-2 which is farther away from the second pad 150H, but the present disclosure is not limited thereto.

According to some other embodiments of the present disclosure, one of the third pads 124 may have a third pad shape, one of the second pads 150 may have a second pad shape, or one of the first pads 140 may have a first pad shape. The third pad shape, the second pad shape or the first pad shape may be independently selected from a spherical shape, an elliptical shape, other suitable three-dimensional shapes, or a combination of the above, but the present disclosure is not limited thereto. For example, a second pad 150 may include a plurality of sub-pad units, or a third pad 124 may include a plurality of sub-pad units. The sub-pad units may be fabricated through a pad reflow process, but the present disclosure is not limited thereto.

According to some embodiments of the present disclosure, the third pad shapes may be different from the second pad shapes, the second pad shapes may be different from the first pad shapes, the third pad shapes may be different from each other, and/or the second pad shapes may be different from each other. FIG. 6 shows an embodiment in which the first pad 140J, the first pad 140K, the second pad 150J or the third pad 124K are respectively spherical, the second pad 150K may be in a form of a snowman shape with the sub-pad units 150K-1 and 150K-2 to be a larger ball 150K-1 combined with a smaller ball 150K-2, the third pad 124J may be in a form of a mickey mouse face shape with the sub-pad units 124J-1, 124J-2 and 124J-3 to be a larger ball 124J-1 combined with two smaller balls 124J-2 and 124J-3, and each of the third pads 124 may have a third pad size S3, but the present disclosure is not limited thereto.

Please refer to FIG. 1, the third region 123 may be a region of the semiconductor device 100 including the device side E, and has a third region width. According to some embodiments of the present disclosure, the width of the third region may be a width extending by up to ¼M from the device side E to a direction perpendicular to the device side E. Alternatively, the width of the third region may be a width extending inwardly by ¼M in a vertical direction along the device side E. In other words, the third region 123 may have a third region area up to M/4×M. In some embodiments, the second region width D/6 may overlap the third region width M/4 such that the third region 123 may overlap the second region 120. In some other embodiments, the second region width D/6 may not overlap the third region width M/4, so that the third region 123 may not overlap the second region 120. FIG. 1 illustrates an embodiment in which the third region 123 may overlap the second region 120, and FIG. 2 illustrates another embodiment in which the third region 123 may not overlap the second region 120.

According to the semiconductor devices of the embodiments of the present disclosure, a proposal for the under-bump metals (UBM) and for the pad layouts may be provided, which is helpful to balance the stress in different regions, thereby reducing the risk of pad cracking or peeling from a chip, overcoming the electrical problems or the problems which causes the electrical reliability, helps to achieve the advantages of improving the reliability of the electronic device, for example the beneficial efficacy of improving the alignment accuracy or reducing the stress. There may be various examples of the pad layout proposal in the present disclosure. For example, as far as the pad layout proposal where an outer region surrounds an inner region is concerned, the inner pitch between the inner pads in the corresponding inner region may be adjusted to be smaller than the outer pitch between the outer pads in the corresponding outer region, or the inner pad size may be adjusted to be smaller than the outer pad size. Alternatively, the outer pad size may increase gradually along an arrangement direction. Alternatively, the outer pad may include a plurality of sub-pad units, or the shape of the outer pads may be different from that of the inner pads.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A semiconductor device comprising a first region and a second region, the second region surrounding the first region, and the semiconductor device comprising:
   at least one electronic unit;
   a redistribution structure electrically connected to the at least one electronic unit, wherein the redistribution structure comprises a side away from the at least one electronic unit;
   a plurality of first pads disposed on the side of the redistribution structure and disposed corresponding to the first region, and a first pitch existing between two adjacent ones of the plurality of first pads; and
   a plurality of second pads disposed on the side of the redistribution structure and disposed corresponding to the second region, and a second pitch existing between two adjacent ones of the plurality of second pads, wherein in a normal direction of the semiconductor device, adjacent ones of the second pitches among at least three adjacent ones of the plurality of second pads arranged continuously along a direction perpendicular to the normal direction of the semiconductor device are different from each other,
   wherein the first pitch is smaller than the second pitch.

2. The semiconductor device of claim 1, wherein each one of the plurality of second pads has a second pad size, and the second pad sizes of at least three of the plurality of second pads continuously arranged along a direction away from the first region increases gradually.

3. The semiconductor device of claim 1, wherein the at least one electronic unit has one side, and the side does not overlap with the plurality of second pads.

4. The semiconductor device of claim 3, wherein the side has a die side length D, and the second region comprises the side and has a second region width extending by ⅙D from the side along a direction perpendicular to the side.

5. The semiconductor device of claim 1, further comprising:
   a third region surrounding the second region; and
   a plurality of third pads disposed on the redistribution structure and disposed corresponding to the third region, wherein a pad size of one of the plurality of second pads is smaller than a pad size of one of the plurality of third pads.

6. The semiconductor device of claim 5, wherein each one of the plurality of third pads has a third pad size, and the third pad size of at least three of the plurality of third pads continuously arranged along a direction away from the second region increases gradually.

7. The semiconductor device according to claim 5, wherein a third pitch exists between two adjacent ones of the plurality of third pads, and adjacent ones of the third pitches among the plurality of third pads arranged continuously along a direction away from the second region are different from each other.

8. The semiconductor device of claim 7, wherein the second pitches are smaller than the third pitches.

9. The semiconductor device of claim 5, wherein a third pad shape of one of the plurality of third pads and a second pad shape of one of the plurality of second pads are different.

10. The semiconductor device of claim 5, wherein the semiconductor device has a device side, the device side has a device side length M, and the third region comprises the device side and has a third region width extending by $\frac{1}{4}M$ from the device side along a direction perpendicular to the device side.

11. The semiconductor device of claim 10, wherein the at least one electronic unit has a side, the side has a side length D, and the second region has a second region width extending by $\frac{1}{8}D$ from the side along a direction perpendicular to the side.

12. The semiconductor device of claim 11, wherein $D>M/2$.

13. The semiconductor device of claim 11, wherein $D<M/2$.

14. The semiconductor device of claim 1, wherein the plurality of first pads and the plurality of second pads together form an annular layout.

15. The semiconductor device of claim 1, wherein the plurality of first pads and the plurality of second pads together form a matrix layout.

16. The semiconductor device of claim 1, wherein one of the plurality of second pads comprises a plurality of sub-pad units.

17. The semiconductor device of claim 1, wherein the at least one electronic unit further comprises:
    at least one chip;
    a conductive structure electrically connected to the at least one chip; and
    an insulating layer disposed among the redistribution structure, the at least one chip and the conductive structure.

18. The semiconductor device of claim 17, wherein the plurality of first pads and the plurality of second pads are respectively electrically connected to the at least one chip via the conductive structure.

* * * * *